United States Patent
Johnson

(10) Patent No.: US 12,483,214 B2
(45) Date of Patent: Nov. 25, 2025

(54) DISTORTION NETWORK WITH CHANNELIZED RESISTORS

(71) Applicant: Skyworks Solutions, Inc., Irvine, CA (US)

(72) Inventor: Douglas M. Johnson, Doylestown, PA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/734,989

(22) Filed: Jun. 5, 2024

(65) Prior Publication Data

US 2025/0007472 A1    Jan. 2, 2025

Related U.S. Application Data

(63) Continuation of application No. 18/052,779, filed on Nov. 4, 2022, now Pat. No. 12,034,417, which is a continuation of application No. 17/003,844, filed on Aug. 26, 2020, now Pat. No. 11,509,273.

(60) Provisional application No. 62/892,375, filed on Aug. 27, 2019, provisional application No. 62/906,632, filed on Sep. 26, 2019.

(51) Int. Cl.
- H03F 1/32 (2006.01)
- H03F 3/195 (2006.01)
- H03F 3/24 (2006.01)

(52) U.S. Cl.
CPC ............ *H03F 3/245* (2013.01); *H03F 3/195* (2013.01); *H03F 2200/451* (2013.01)

(58) Field of Classification Search
CPC .................................... H03F 1/32; H03F 1/30
USPC ................................................. 330/149, 297
See application file for complete search history.

(56) References Cited

U.S. PATENT DOCUMENTS

| | | | |
|---|---|---|---|
| 4,720,686 A | 1/1988 | Westwick |
| 5,049,831 A | 9/1991 | Westwick |
| 6,404,284 B1 | 6/2002 | Johnson |
| 6,639,466 B2 | 10/2003 | Johnson |
| 6,842,075 B2 | 1/2005 | Johnson et al. |
| 6,853,526 B1 | 2/2005 | Saders et al. |
| 6,998,920 B2 | 2/2006 | Krutko et al. |
| 7,301,396 B1 | 11/2007 | Johnson |
| 7,459,974 B2 | 12/2008 | Johnson et al. |
| 8,102,207 B2 | 1/2012 | Day |
| 8,427,241 B2 | 4/2013 | Ezzeddine et al. |
| 11,128,261 B2 | 9/2021 | Ranta et al. |
| 11,329,609 B2 | 5/2022 | Johnson et al. |
| 11,509,273 B2 | 11/2022 | Johnson |
| 12,034,417 B2 | 7/2024 | Johnson |
| 2003/0020540 A1 | 1/2003 | Johnson |
| 2003/0155977 A1 | 8/2003 | Johnson et al. |

(Continued)

*Primary Examiner* — Henry Choe

(74) *Attorney, Agent, or Firm* — Knobbe, Martens, Olson & Bear, LLP

(57) ABSTRACT

Apparatus and methods for power amplifier distortion networks are disclosed. In one aspect, there is provided a power amplifier system including a power amplifier configured to amplify a radio frequency input signal. The power amplifier including an input configured to receive the radio frequency input signal and an output configured to generate an amplified radio frequency signal. The power amplifier system further includes a distortion network electrically coupled to either the input or the output of the power amplifier. The distortion network including a plurality of channelized resistors. The channelized resistors connected in series to either an input or an output of the power amplifier.

20 Claims, 15 Drawing Sheets

(56) References Cited

U.S. PATENT DOCUMENTS

2008/0186096 A1    8/2008   Johnson et al.
2020/0365129 A1   11/2020   Baker
2021/0091724 A1    3/2021   Johnson et al.

DISTORTION NETWORK WITH CHANNELIZED RESISTORS

CROSS-REFERENCE TO RELATED APPLICATION(S)

This application is a continuation of U.S. application Ser. No. 18/052,779, filed Nov. 4, 2022, which is a continuation of U.S. application Ser. No. 17/003,844, filed Aug. 26, 2020, which claims the benefit of U.S. Provisional Application No. 62/892,375, filed Aug. 27, 2019, and the benefit of U.S. Provisional Application No. 62/906,632, filed Sep. 26, 2019. Each of the foregoing applications are hereby incorporated by reference in their entirety.

BACKGROUND

Field

The systems and methods disclosed herein are directed to electronic systems, and in particular, to radio frequency (RF) electronics.

Description of the Related Technology

RF power amplifiers can be used to boost the power of an RF signal having a relatively low power. Thereafter, the boosted RF signal can be used for a variety of purposes, included driving an antenna of a transmitter.

Power amplifiers can be included in mobile phones to amplify an RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify an RF signal. Power amplifiers can also be used in other applications, such as amplifying cable television (CATV) signals.

SUMMARY

The systems, methods and devices of this disclosure each have several innovative aspects, no single one of which is solely responsible for the desirable attributes disclosed herein.

In one aspect, there is provided a power amplifier system comprising a power amplifier configured to amplify a radio frequency input signal, the power amplifier including an input configured to receive the radio frequency input signal and an output configured to generate an amplified radio frequency signal; and a distortion network electrically coupled to either the input or the output of the power amplifier, the distortion network including a plurality of channelized resistors, the channelized resistors connected in series to either an input or an output of the power amplifier.

The input of the power amplifier can include a pair of differential inputs, the output of the power amplifier includes a pair of differential outputs, and the distortion network is connected between either the differential inputs or the differential outputs.

The distortion network can be connected between ground and one of the input and the output of the power amplifier.

A channel width of each of the channelized resistors can be selected to reduce gain compression of the power amplifier.

A channel length of each of the channelized resistors can be selected to reduce gain compression of the power amplifier.

The distortion network can further include a capacitor connected in series with the plurality of channelized resistors.

A capacitance of the channelized resistor can be selected to reduce phase compression of the power amplifier.

The distortion network can be formed on a same die as the power amplifier.

In another aspect, there is provided a distortion network for a power amplifier, the distortion network comprising: a plurality of channelized resistors, the channelized resistors connected in series to either an input or an output of the power amplifier.

The input of the power amplifier can include a pair of differential inputs, the output of the power amplifier includes a pair of differential outputs, and the distortion network is connected between either the differential inputs or the differential outputs.

The distortion network can be connected between ground and one of the input and the output of the power amplifier.

A channel width of each of the channelized resistors can be selected to reduce gain compression of the power amplifier.

A channel length of each of the channelized resistors can be selected to reduce gain compression of the power amplifier.

The distortion network can further comprise a capacitor connected in series with the plurality of channelized resistors.

A capacitance of the channelized resistor can be selected to reduce phase compression of the power amplifier.

The distortion network can be formed on a same die as the power amplifier.

In yet another aspect, there is provided a power amplifier die comprising: a power amplifier configured to amplify a radio frequency input signal, the power amplifier including an input configured to receive the radio frequency input signal and an output configured to generate an amplified radio frequency signal; and a distortion network electrically coupled to either the input or the output of the power amplifier, the distortion network including a plurality of channelized resistors, the channelized resistors connected in series to either an input or an output of the power amplifier, each of the power amplifier and the distortion network formed on the power amplifier die.

The input of the power amplifier can include a pair of differential inputs, the output of the power amplifier includes a pair of differential outputs, and the distortion network is connected between either the differential inputs or the differential outputs.

The distortion network can be connected between ground and one of the input and the output of the power amplifier.

A channel width of each of the channelized resistors can be selected to reduce gain compression of the power amplifier.

A channel length of each of the channelized resistors can be selected to reduce gain compression of the power amplifier.

The distortion network can further include a capacitor connected in series with the plurality of channelized resistors.

A capacitance of the channelized resistor can be selected to reduce phase compression of the power amplifier.

The distortion network can be formed on a same die as the power amplifier.

In still yet another aspect, there is provided a mobile device comprising: an antenna; a power amplifier configured to amplify a radio frequency input signal, the power amplifier including an input configured to receive the radio frequency input signal and an output configured to generate an amplified radio frequency signal, the power amplifier further configured to provide the amplified radio frequency signal to the antenna; and a distortion network electrically coupled to either the input or the output of the power amplifier, the distortion network including a plurality of channelized resistors, the channelized resistors connected in series to either an input or an output of the power amplifier, each of the power amplifier and the distortion network formed on the power amplifier die.

The input of the power amplifier can include a pair of differential inputs, the output of the power amplifier includes a pair of differential outputs, and the distortion network is connected between either the differential inputs or the differential outputs.

The distortion network can be connected between ground and one of the input and the output of the power amplifier.

A channel width of each of the channelized resistors can be selected to reduce gain compression of the power amplifier.

DETAILED DESCRIPTION OF EMBODIMENTS

The headings provided herein, if any, are for convenience only and do not necessarily affect the scope or meaning of the claimed invention.

Overview of Examples of Power Amplifier Systems

Figure 1:
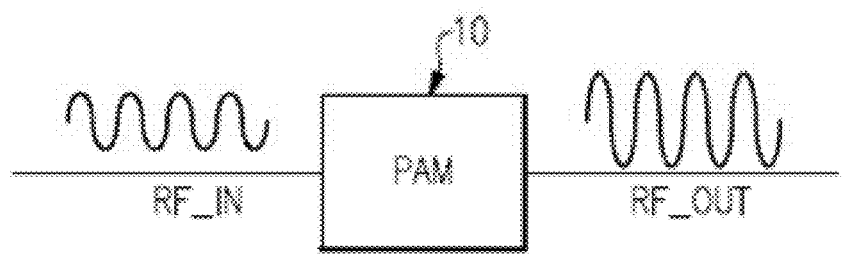
FIG. 1 is a schematic block diagram of a power amplifier module for amplifying a radio frequency (RF) signal.

FIG. 1 is a schematic block diagram of a power amplifier module for amplifying a radio frequency (RF) signal. The illustrated power amplifier module (PAM) 10 can be configured to amplify an RF signal RF_IN to generate an amplified RF signal RF_OUT. As described herein, the power amplifier module can include one or more power amplifiers.

Figure 2:
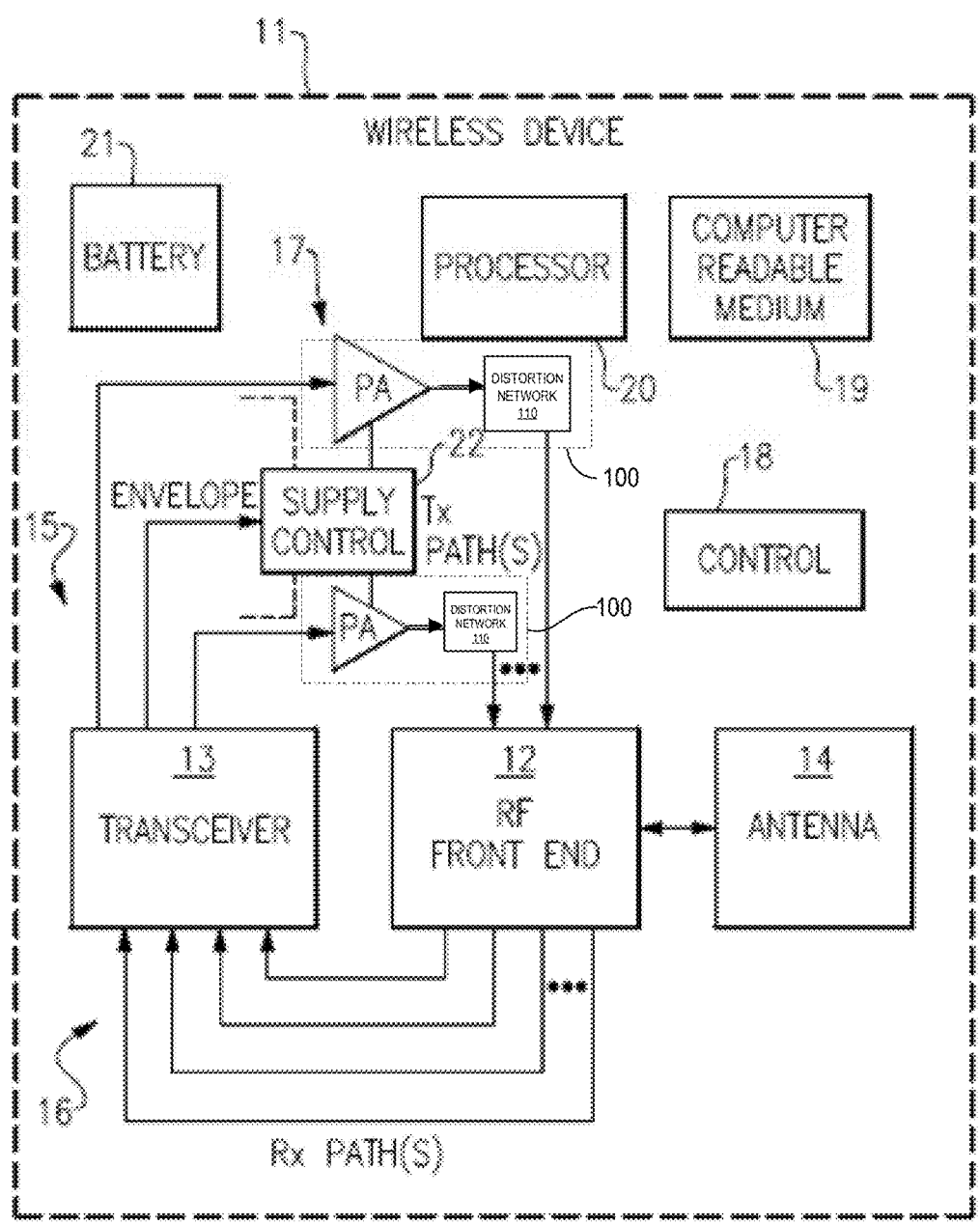
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules 10 of FIG. 1. The wireless device 11 can include power amplifiers implementing one or more features of the present disclosure.

The example wireless device 11 depicted in FIG. 2 can be a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 or more radio frequency spectrum bands.

One or more features of the present disclosure can be implemented in the foregoing example modes and/or bands, and in other communication standards. For example, 3G, 4G, LTE, advanced LTE, 5G, and 5G NR are non-limiting examples of such standards.

The illustrated wireless device 11 includes an RF front end 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power and high power), and/or amplifications associated with different bands. Each of the power amplifiers 17 may be electrically connected to a corresponding distortion network 110 to form a power amplifier system 100. Additional details of the distortion network 110 are provided below. Although the configuration illustrated in FIG. 2 includes two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the configuration illustrated in FIG. 2 includes four receiving paths 16, the wireless device 11 can be adapted to include more or fewer receiving paths 16.

To facilitate switching between receive and transmit paths, the RF front end 12 can be configured to electrically connect the antenna 14 to a selected transmit or receive path. Thus, the RF front end 12 can provide a number of switching functionalities associated with an operation of the wireless device 11. In certain embodiments, the RF front end 12 can include a number of switches configured to provide functionalities associated with, for example, switching between different bands, switching between different power modes, switching between transmission and receiving modes, or some combination thereof. The RF front end 12 can also be configured to provide additional functionality, including filtering of signals. For example, the RF front end 12 can include one or more duplexers.

FIG. 2 shows that in certain embodiments, a control component 18 can be provided, and such a component can be configured to provide various control functionalities associated with operations of the RF front end 12, the power amplifiers 17, the supply control block 22, and/or other operating component(s). Non-limiting examples of the control component 18 are described herein in greater detail.

In certain embodiments, a processor 20 can be configured to facilitate implementation of various control processes. In certain configurations, the processor 20 operates using computer program instructions, which can be stored in a computer-readable memory 19.

The illustrated wireless device 11 also includes the supply control block 22, which can be used to provide a power amplifier supply voltage to one or more of the power amplifiers 17. For example, the supply control block 22 can be an envelope tracker configured to control the voltage level of the power amplifier supply voltage based upon an envelope of an RF signal to be amplified by one or more of the power amplifiers. However, in certain embodiments the supply control block 22 can be other blocks, including, for example, a DC-to-DC converter.

The supply control block 22 can be electrically connected to the battery 21, and the supply control block 22 can control the voltage level of the supply voltage provided to the power amplifiers 17 based on an envelope of the RF signal to be amplified. The battery 21 can be any suitable battery for use in the wireless device 11, including, for example, a lithium-ion battery. By controlling the voltage level of the power amplifier supply voltage provided to the power amplifiers, the power consumption of the battery 21 can be reduced, thereby improving performance of the wireless device 11. As illustrated in FIG. 2, the envelope signal can be provided to the supply control block 22 from the transceiver 13. However, the envelope can be determined in other ways. For example, the envelope can be determined by detecting the envelope from the RF signal using any suitable envelope detector.

Although FIG. 2 illustrates an example wireless or mobile device 11 that can use a power amplifier system 100 including a distortion network 110, this disclosure can also apply to the use of a distortion network 110 in other applications. For example, a power amplifier system 100 and distortion network 110 can also be used in CATV applications for amplifying a CATV signal.

Overview of Examples of Power Amplifier Distortion Networks

Aspects of this disclosure relate to distortion networks 110 that can be used to flatten the gain vs. output power of a power amplifier system 100. As is described in detail below, the distortion network 110 may comprise one or more channelized resistors configured to improve the gain characteristics of the power amplifier system 100. Depending on the embodiment, the distortion network 110 may be connected to a power amplifier 32 in a number of different configurations.

Figure 3:
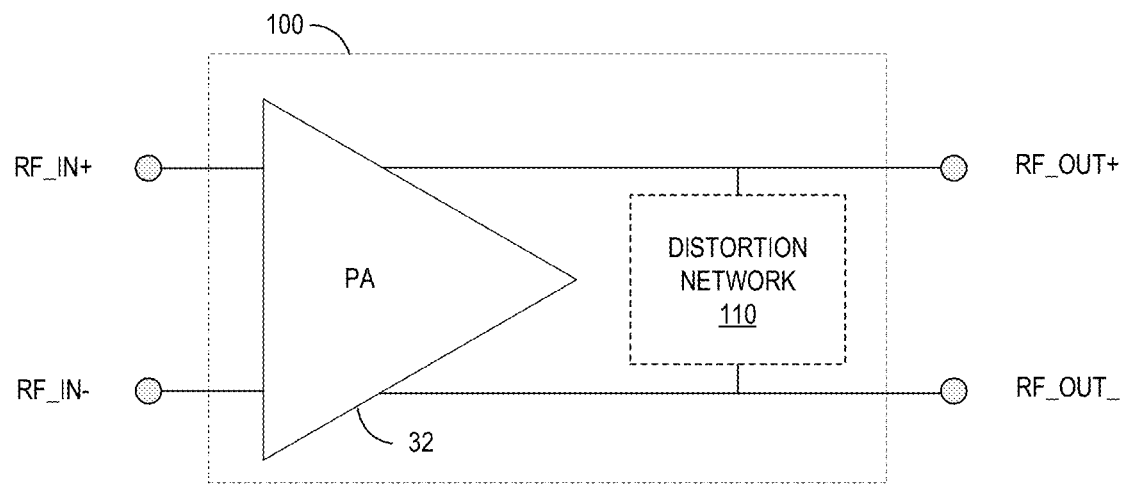
FIG. 3 is a schematic block diagram of one example of a power amplifier system.

FIG. 3 is a schematic block diagram of one example of a power amplifier system. The power amplifier system 100 includes a power amplifier 32 and a distortion network 110. In particular, in the embodiment of FIG. 3, the power amplifier 32 is a fully differential amplifier having two differential RF inputs RF_IN+ and RF_IN− and two differential RF outputs RF_OUT+ and RF_OUT−. In this example, the distortion network 110 is connected between the differential outputs RF_OUT+ and RF_OUT− of the power amplifier 32 to form a post-distortion system.

Figure 4:
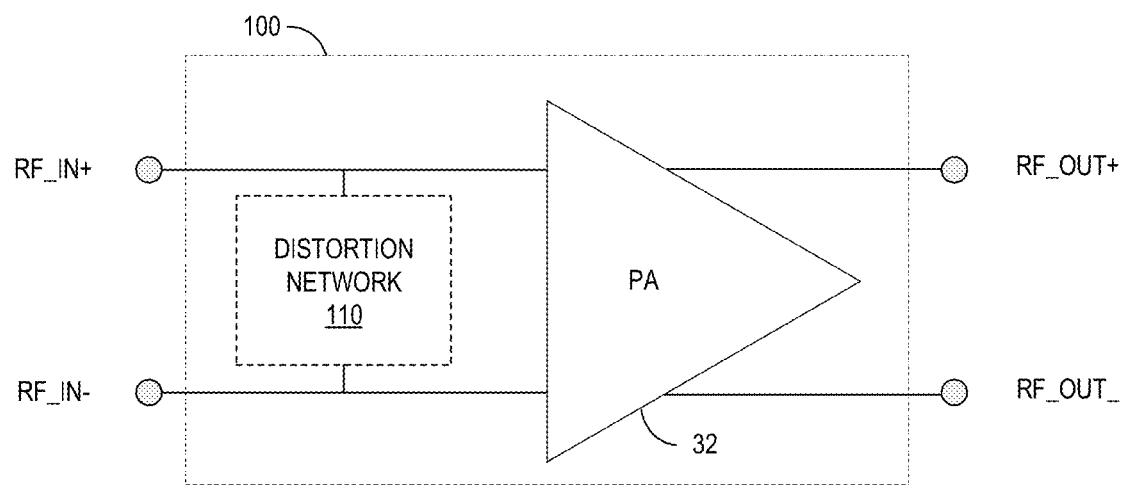
FIG. 4 is a schematic block diagram of another example of a power amplifier system.

FIG. 4 is a schematic block diagram of another example of a power amplifier system. The power amplifier system 100 includes a power amplifier 32 and a distortion network 110. Similar to FIG. 3, the embodiment of FIG. 4, the power amplifier 32 is a fully differential amplifier having two differential RF inputs RF_IN+ and RF_IN− and two differential RF outputs RF_OUT+ and RF_OUT−. In this example, the distortion network 110 is connected between the differential inputs RF_IN+ and RF_IN− of the power amplifier 32 to form a pre-distortion system.

Figure 5:
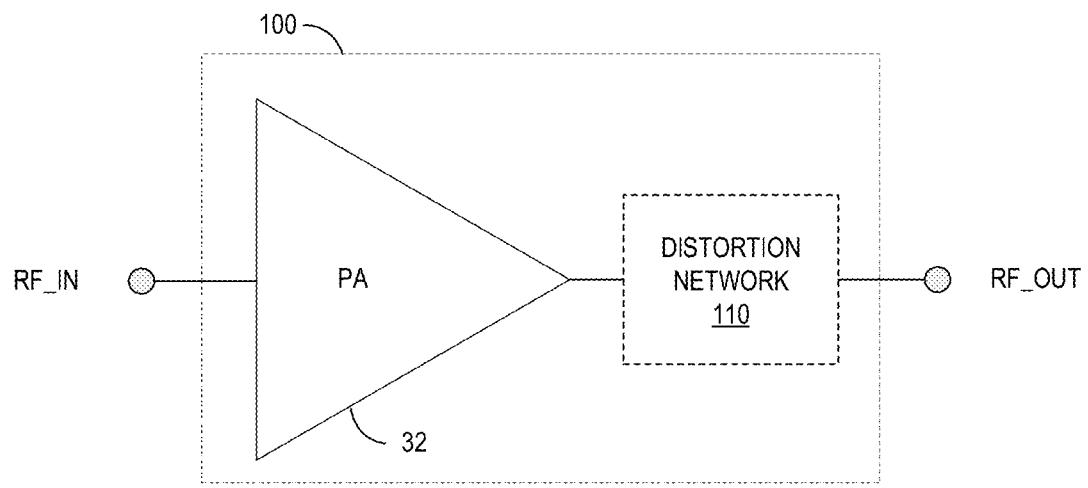
FIG. 5 is a schematic block diagram of yet another example of a power amplifier system.

FIG. 5 is a schematic block diagram of yet another example of a power amplifier system. The power amplifier system 100 includes a power amplifier 32 and a distortion network 110. In particular, in the embodiment of FIG. 5, the power amplifier 32 has an RF input RF_IN and an RF output RF_OUT. Depending on the embodiment, the power amplifier 32 may be a differential amplifier with one of the inputs connected to a power supply rail (e.g., ground). In this example, the distortion network 110 is connected to the RF output RF_OUT to form a post-distortion system. Although not illustrated, the distortion network 110 may be serially connected between the RF output RF_OUT and the power supply rail (e.g., ground).

Figure 6:
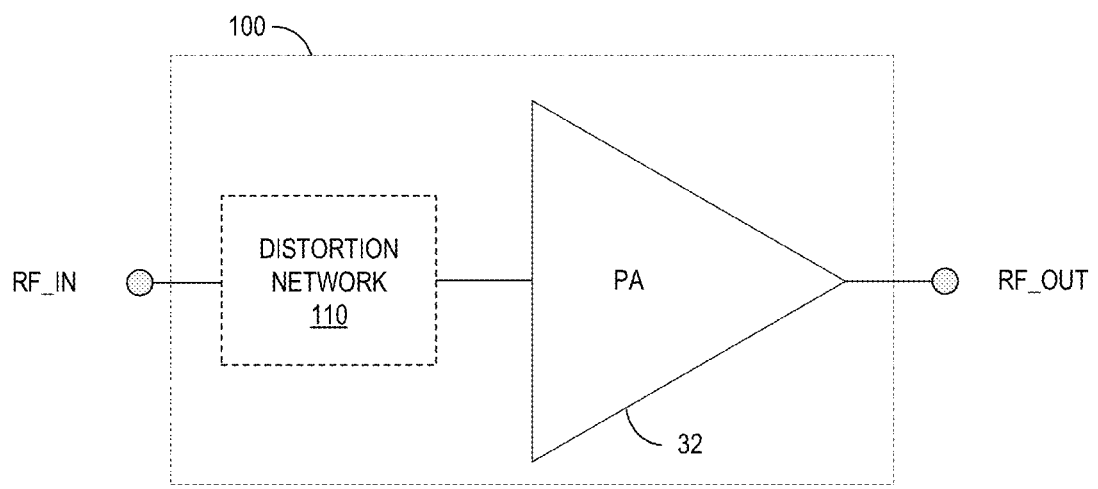
FIG. 6 is a schematic block diagram of still yet another example of a power amplifier system.

FIG. 6 is a schematic block diagram of still yet another example of a power amplifier system. The power amplifier system 100 includes a power amplifier 32 and a distortion network 110. Similar to FIG. 5, the embodiment of FIG. 6, the power amplifier 32 has an RF input RF_IN and an RF output RF_OUT. Depending on the embodiment, the power amplifier 32 may be a differential amplifier with one of the inputs connected to a power supply rail (e.g., ground). In this example, the distortion network 110 is connected to the differential input RF_IN of the power amplifier 32 to form a pre-distortion system. Although not illustrated, the distortion network 110 may be serially connected between the RF output RF_OUT and the power supply rail (e.g., ground).

According to aspects of this disclosure, the distortion network 110 may include one or more channelized resistors. In some embodiments, a channelized resistor may be formed as a transistor without a gate. For example, a channelized resistor can be formed as a field-effect transistor (FET) formed without including a gate electrode. In another example, a channelized resistor can be formed as a field-effect transistor (FET) having a floating gate (e.g., a gate that is electrically isolated from the remainder of the circuit).

Figure 7A:
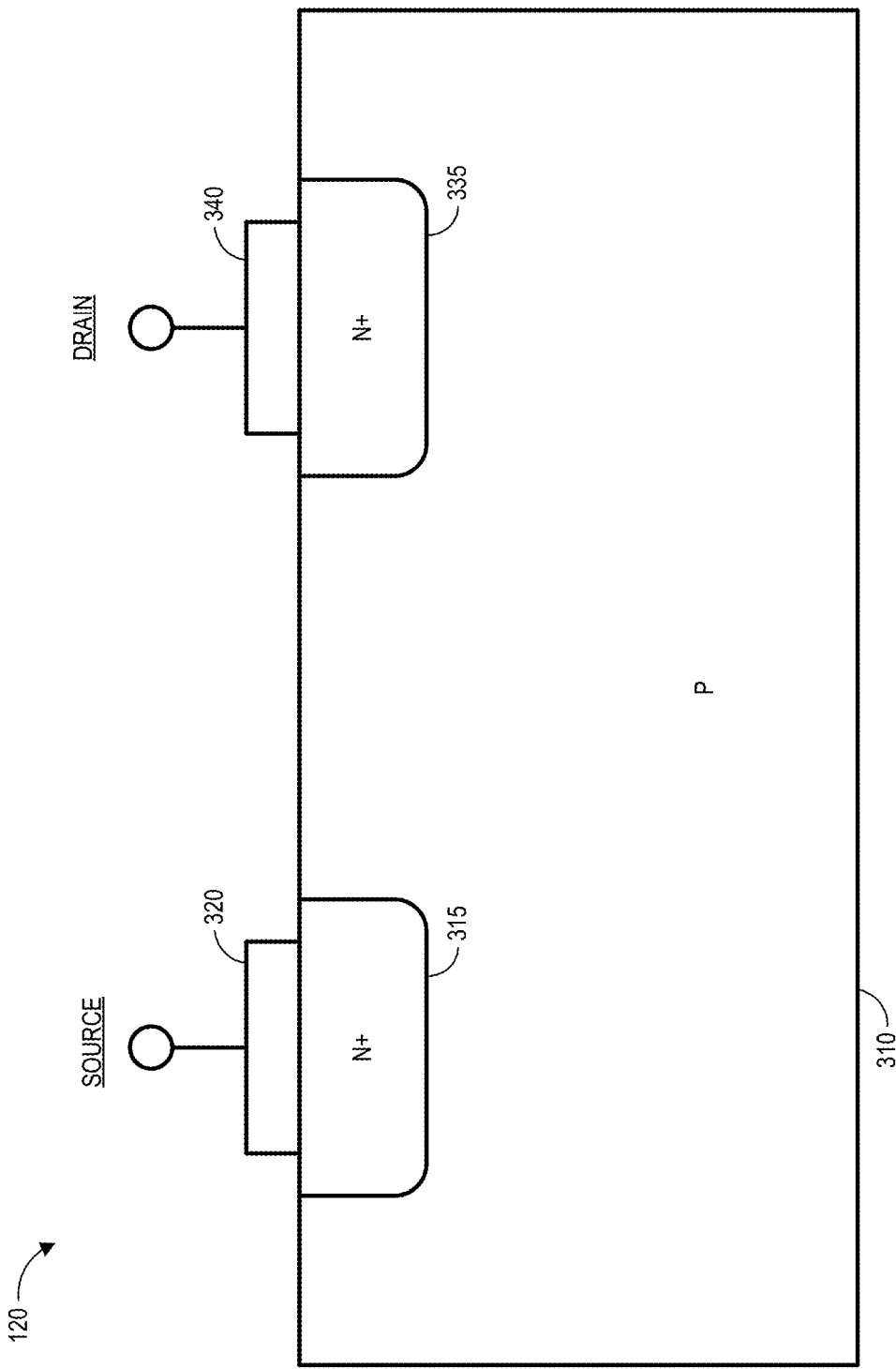
FIG. 7A is a cross-sectional view of an idealized channelized resistor in accordance with aspects of this disclosure.

FIG. 7A is a cross-sectional view of an idealized channelized resistor in accordance with aspects of this disclosure. The channelized resistor 120 includes a body 310, and two terminals 320 and 340. The body 310 may be p doped with two n+ doped regions 315 and 335 corresponding to each of the terminals 320 and 340. Since the channelized resistor 310 may be analogous to an FET transistor, the terminals 320 and 340 may also be referred to as a source terminal 320 and a drain terminal 340. In addition, the doping of the various regions may be reversed in other embodiments (e.g., an n doped body 310 and p+ doped regions 315 and 335.

Since the channelized resistor 120 does not include a gate electrode in the embodiment of FIG. 7A, the channel conductivity (e.g., the conductivity between the n+ doped regions 315 and 335) is not controllable by a gate voltage. Rather, the conductivity, and hence resistance, of the channelized resistor 120 is dependent only on the drain-to-source voltage applied between the terminals 320 and 340. In other words, the size of the channel (e.g., an n-channel) formed between the n+ doped regions 315 and 335, and thus, the conductivity, may be controlled based on the voltage applied between the source terminal 320 and the drain terminal 340, thereby controlling the overall resistance of the channelized resistor 120. Although not illustrated, the body 310 may also receive a bias voltage in certain embodiments, which can be connected to a power supply rail depending on the implementation.

Figure 7B:
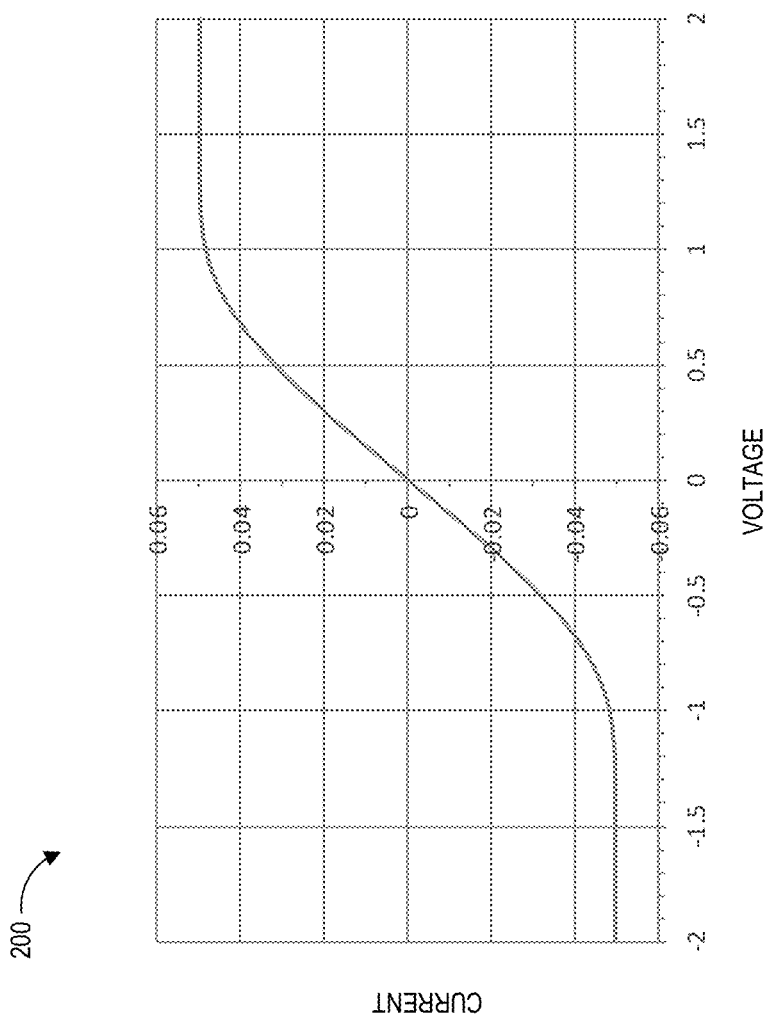
FIG. 7B illustrates a plot of the current vs. drain-to-source voltage of an example channelized resistor.

FIG. 7B illustrates a plot of the current vs. drain-to-source voltage of an example channelized resistor. As shown in the plot 200, the current vs. drain-to-source voltage (also referred to herein simply as the voltage) of the channelized resistor forms a substantially hyperbolic tangent curve.

In some embodiments, the resistance of a channelized resistor may be substantially equal to the delta voltage divided by the delta current (e.g., instantaneous change in the voltage divided by the instantaneous change in current). As can be seen from the plot 200, near a voltage of about 0, the resistance of the channelized resistor may have a first value (e.g., a relatively low value). As the voltage increases, the instantaneous change in current decreases, thereby causing an increase in the instantaneous resistance of the channelized resistor. This increase in resistance of the channelized resistor continues as the voltage increases until the point at which the channel saturates and the current no longer increases with increasing voltage. At this point, the instantaneous resistance is substantially infinite.

Example Distortion Networks

Aspects of this disclosure related to distortion networks that may comprise one or more channelized resistors. The distortion network may be coupled across the inputs or outputs of a differential amplifier as shown in FIGS. 3-6. In certain embodiments, the addition of the distortion network to an amplifier can cause the gain of the amplifier to be reduced at relatively low frequency input/output signal RF_IN, RF_OUT levels. As the frequency of the input/output signal RF_IN, RF_OUT increases, the instantaneous resistance of the channelized resistors included in the distortion network increases, thereby reducing the loss to the amplifier, effectively increasing the gain peaks. By designing a distortion network having one or more channelized resistors with appropriate characteristics, the distortion network can be used to correct gain compression vs output power of the amplifier and improve both output power capability and distortion of the amplifier.

Figure 8:
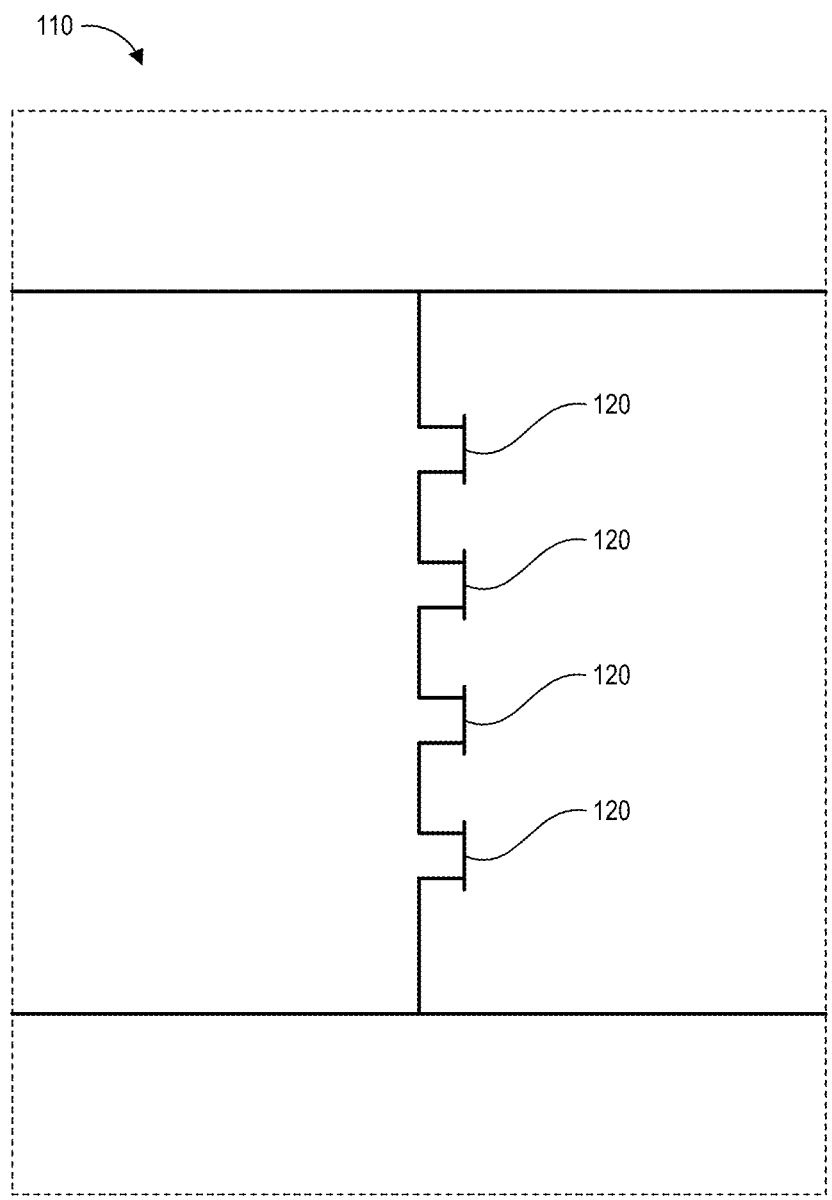
FIG. 8 is a circuit diagram illustrating an example distortion network in accordance with aspects of this disclosure.

FIG. 8 is a circuit diagram illustrating an example distortion network in accordance with aspects of this disclosure. In particular, the distortion network 110 includes a plurality of channelized resistors 120. As shown in FIG. 8, the channelized resistors 120 are illustrated as transistors without having a gate. The distortion network 110 of FIG. 8 can be connected between the differential outputs RF_OUT+, RF_OUT− of a power amplifier 32 as shown in FIG. 3 or between the differential inputs RF_IN+, RF_IN− of a power amplifier 32 as shown in FIG. 4. As shown in FIG. 8, the distortion network 110 comprises four channelized resistors 120 connected in series between the differential outputs or the differential inputs of a power amplifier.

Figure 9:
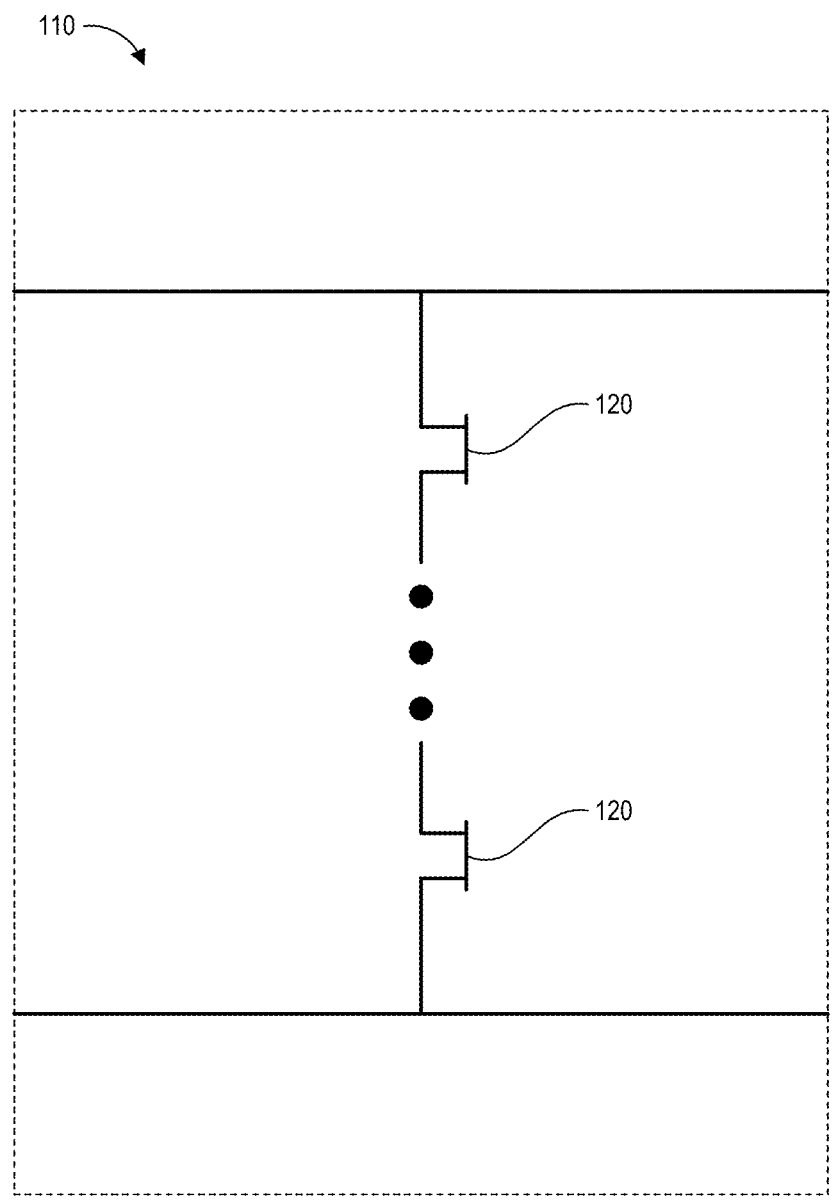
FIG. 9 is a circuit diagram illustrating another example distortion network in accordance with aspects of this disclosure.

However, the number of channelized resistors 120 used in the distortion network 110 can be varied depending on the embodiment. FIG. 9 is a circuit diagram illustrating another example distortion network in accordance with aspects of this disclosure. In particular, the distortion network 110 includes a plurality of channelized resistors 120. As shown in FIG. 9, the number of the channelized resistors 120 can range from a single channelized resistor to an arbitrary large number of channelized resistors 120 connected in series. In exemplary embodiments, five to ten channelized resistors 120 may be connected in series in the distortion network 110. In one example embodiment, seven channelized resistors 120 may be connected in series in the distortion network 110. Similar to the embodiment illustrated in FIG. 8, the distortion network 110 of FIG. 9 includes the channelized resistors 120 connected in series between the differential outputs or the differential inputs of a power amplifier, e.g., as illustrated in FIGS. 3 and 4.

As previously discussed, when the channelized resistors of the distortion networks described herein are scaled correctly, the distortion networks can correct gain compression vs output power for the power amplifier and improve both output power capability and distortion of the power amplifier. In certain embodiments, scaling of the channelized resistors can include varying the number of channelized resistor used in series within the distortion network. The number of channelized resistors used to form the distortion network can affect the loss and the signal level that causes the resistance to increase. In certain embodiments, scaling of the channelized resistors can also include varying the width of each of the channelized resistors (e.g., the gate width without the gate). As the width of a channelized resistor is increased, the resistance of the channelized resistor drain-to-source voltage of about zero is reduced, thereby increasing the loss. In certain embodiments, scaling of the channelized resistors can also include varying the length of the channelized resistor (e.g., the length of the channel). Increasing the length of the channelized resistors increases both the resistance of the channelized resistor and the voltage level at which the resistance increases, e.g., due to channel saturation.

By varying one of more of the above parameters of the channelized resistors, a distortion network of channelized resistors can be designed in order to increase the loss at the input or output of a power amplifier at low-power signals and reduce the loss at the input or output of the power amplifier at high-power signal levels. By properly selecting these parameters, the power amplifier's AM to AM curve (e.g., amplitude modulations vs. output power) can be flattened.

The distortion networks described herein may occupy a relatively small footprint, and thus, may be incorporated onto the same die and the power amplifier. This can reduce the manufacturing costs associated with the distortion network.

Figure 10:
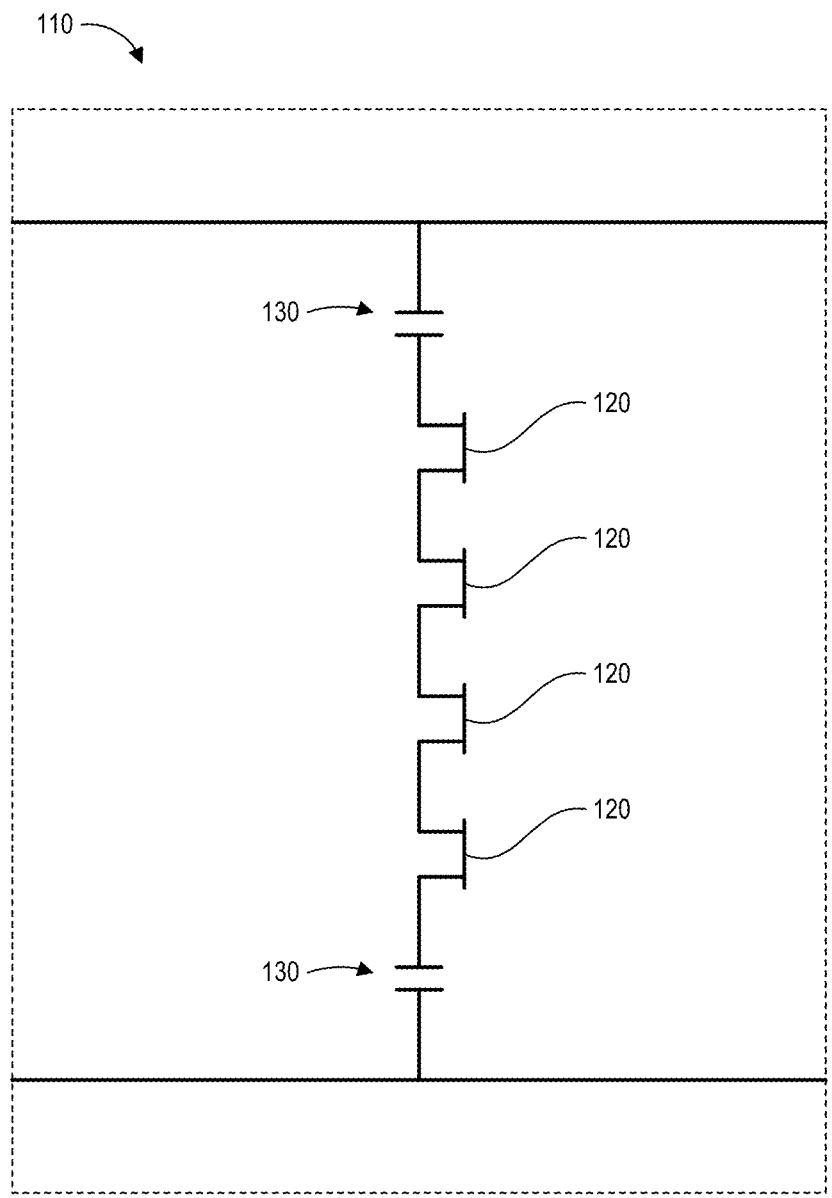
FIG. 10 is a circuit diagram illustrating yet another example distortion network in accordance with aspects of this disclosure.

FIG. 10 is a circuit diagram illustrating yet another example distortion network in accordance with aspects of this disclosure. The distortion network 110 of FIG. 10 is similar to the distortion network 110 of FIG. 9, with the addition of a pair of series capacitors 130. Although the series capacitors 130 are illustrated as being connected on either side of the channelized resistors 120, a greater or fewer number of series capacitors 130 can be used in other embodiments. For example, in some embodiments, a single series capacitor 130 may be added one on end of the channelized resistors 120. In yet other embodiments, one or more series capacitors 130 may be placed in between the channelized resistors 120. Similar to the embodiment illustrated in FIG. 8, the distortion network 110 of FIG. 10 can be connected in series between the differential outputs or the differential inputs of a power amplifier, e.g., as illustrated in FIGS. 3 and 4.

Figure 11:
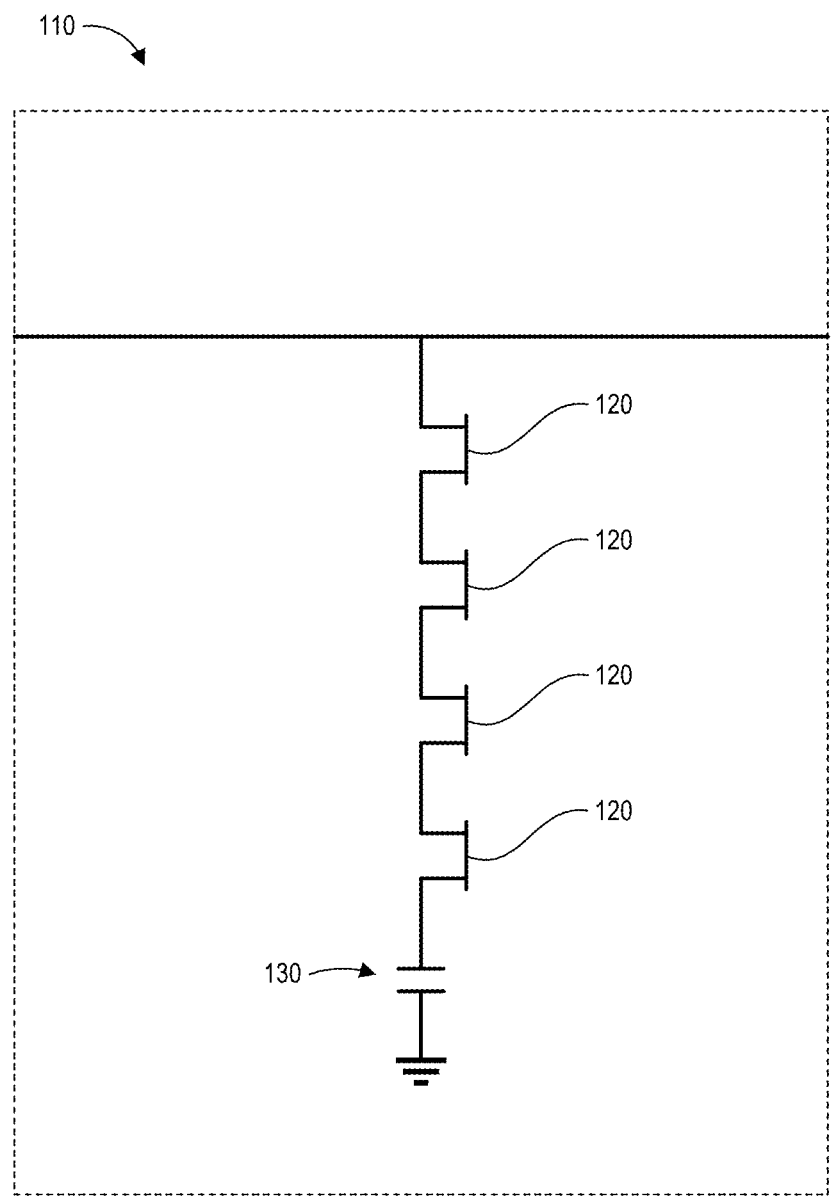
FIG. 11 is a circuit diagram illustrating still yet another example distortion network in accordance with aspects of this disclosure.

The addition of one or more series capacitors 130 to the distortion network 110 can have the additional benefit of correcting AM to PM (e.g., phase modulations vs. output power) at the same time as correcting AM to AM. The distortion network 110 including one or more series capacitors 130 can also be used single ended from the input or output of a power amplifier to ground through a series capacitor 130. FIG. 11 is a circuit diagram illustrating still yet another example distortion network in accordance with aspects of this disclosure. The distortion network 110 of FIG. 11 is similar to the distortion network 110 of FIG. 10, with the addition of a series capacitors 130 connecting the channelized resistors 120 to ground. Although the series capacitors 130 is illustrated as connecting the channelized resistors 120 to ground, a greater or fewer number of series capacitors 130 can be used in other embodiments. The distortion network 110 of FIG. 11 can be connected to the input or output of a single ended power amplifier, e.g., as illustrated in FIGS. 5 and 6. Due to the inclusion of the series capacitor 130, the distortion network 110 of FIG. 11 can be used to correct gain and/or phase compression vs output power similar to the embodiment of FIG. 10.

Figure 12:
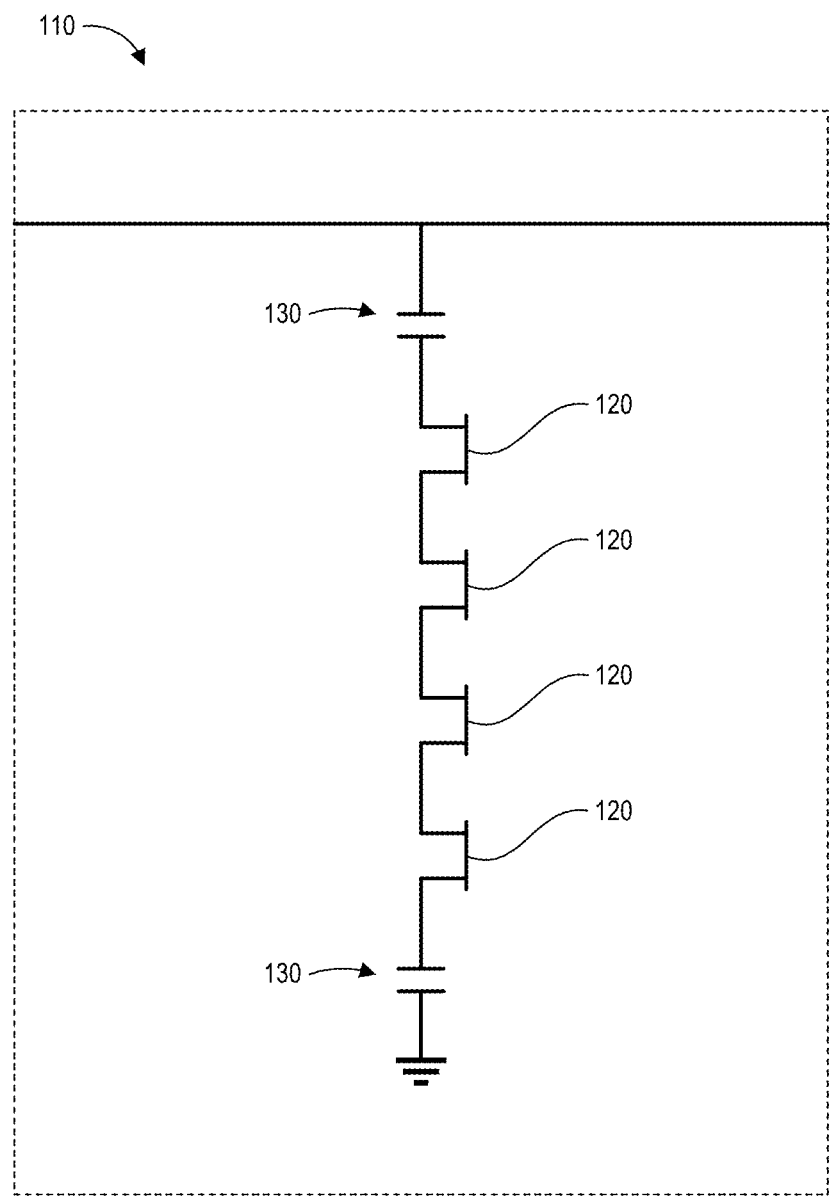
FIG. 12 is a circuit diagram illustrating another example distortion network in accordance with aspects of this disclosure.

FIG. 12 is a circuit diagram illustrating another example distortion network in accordance with aspects of this disclosure. The distortion network 110 of FIG. 12 is similar to the distortion network 110 of FIG. 11, with the addition of a second series capacitor 130 connecting the channelized resistors 120 to the input or output of the power amplifier. The distortion network 110 of FIG. 11 can be connected to the input or output of a single ended power amplifier, e.g., as illustrated in FIGS. 5 and 6. Due to the inclusion of the series capacitors 130, the distortion network 110 of FIG. 12 can be used to correct gain and/or phase compression vs output power similar to the embodiments of FIGS. 10 and 11.

Example Distortion Network Characteristics

Figure 13:
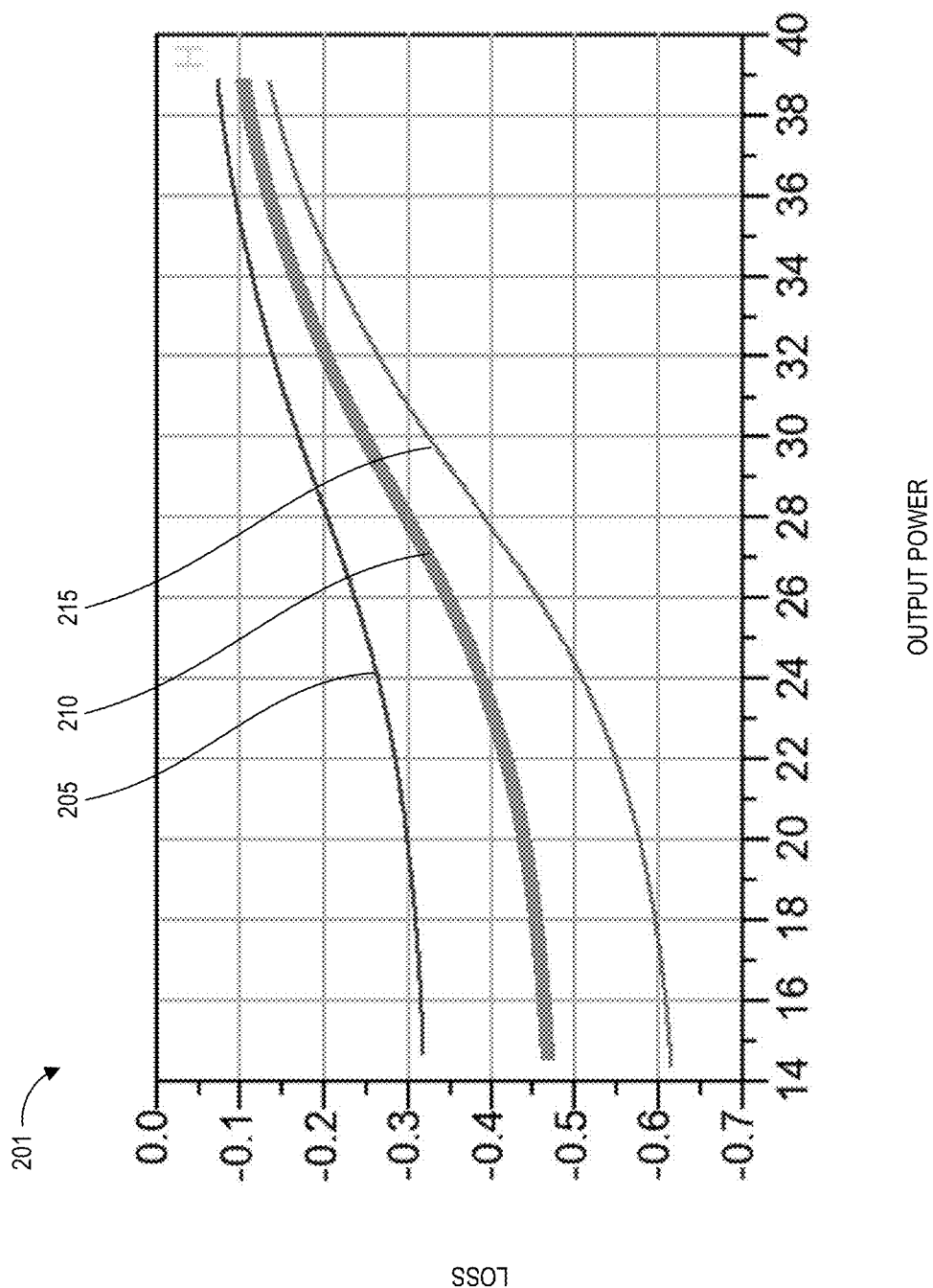
FIG. 13 is a plot illustrating the loss of a distortion network when varying the channel width of the channelized resistors in accordance with aspects of this disclosure.

FIG. 13 is a plot illustrating the loss of a distortion network when varying the channel width of the channelized resistors in accordance with aspects of this disclosure. In particular, the plot 201 illustrates the loss for a distortion network including seven channelized resistors (e.g., see FIG. 9) having widths of 10 µm (curve 205), 15 µm (curve 210), and 20 µm (curve 215). As shown in FIG. 13, as the width of the channels for the channelized resistors increases, the loss increases. Thus, the width of the channels can be selected to compensate for gain compression of a particular power amplifier, thereby flattening the gain vs. output power curve of the power amplifier.

Figure 14:
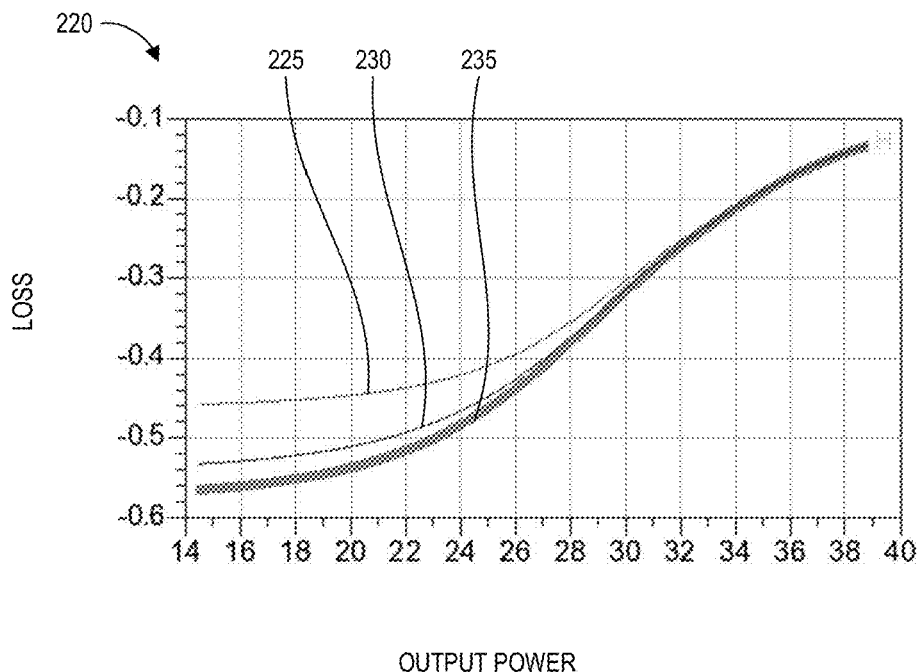
FIG. 14 includes a plot illustrating the loss of another distortion network when varying the capacitance of a series capacitor in accordance with aspects of this disclosure.
Figure 15:
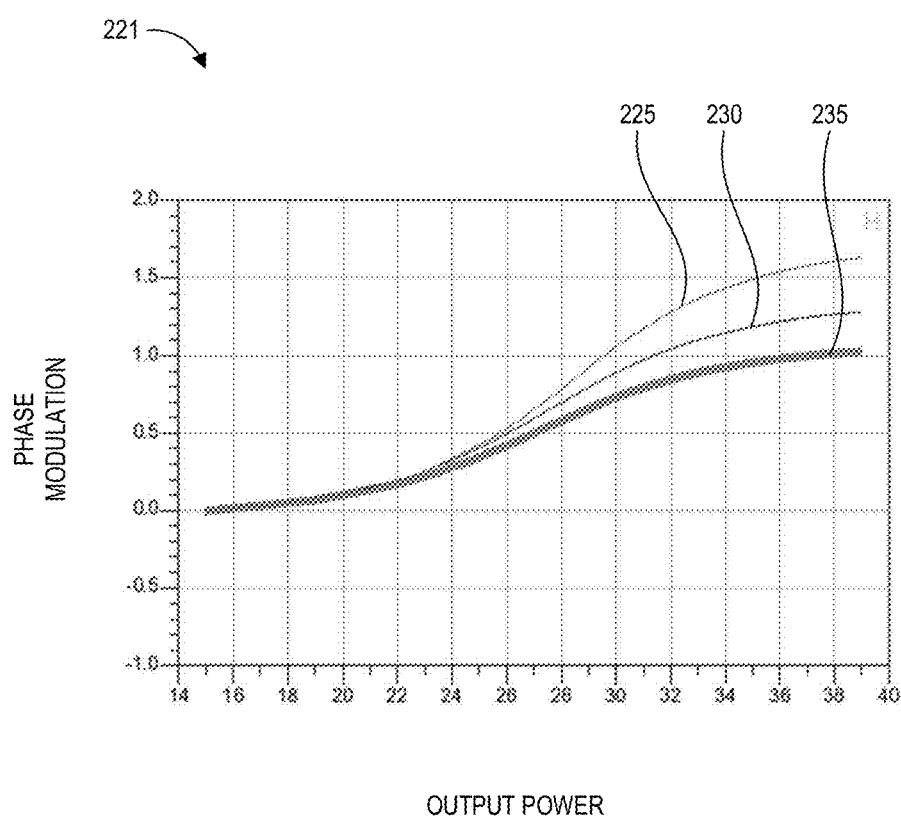
FIG. 15 includes a plot illustrating the phase modulation of the distortion network of FIG. 14 when varying the capacitance of a series capacitor in accordance with aspects of this disclosure.

FIG. 14 includes a plot illustrating the loss of another distortion network when varying the capacitance of a series capacitor in accordance with aspects of this disclosure. In particular, the plot 220 illustrates the loss for a distortion network including seven channelized resistors and a series capacitor having a capacitance of 0.5 pF (curve 225), 0.75 pF (curve 230), and 1.0 pF (curve 235) (e.g., see FIG. 11). FIG. 15 includes a plot 221 illustrating the phase modulation of the distortion network of FIG. 14 when varying the capacitance of a series capacitor in accordance with aspects of this disclosure.

As shown in FIG. 14, as the capacitance of the series capacitor increases, the loss decreases. In addition, as shown in FIG. 15, as the capacitance of the series capacitor increases, the phase modulation increases with output power. Thus, the capacitance of the series capacitor can be selected to compensate for phase compression of a particular power amplifier, thereby flattening the phase modulation vs. output power curve of the power amplifier.

Figure 16:
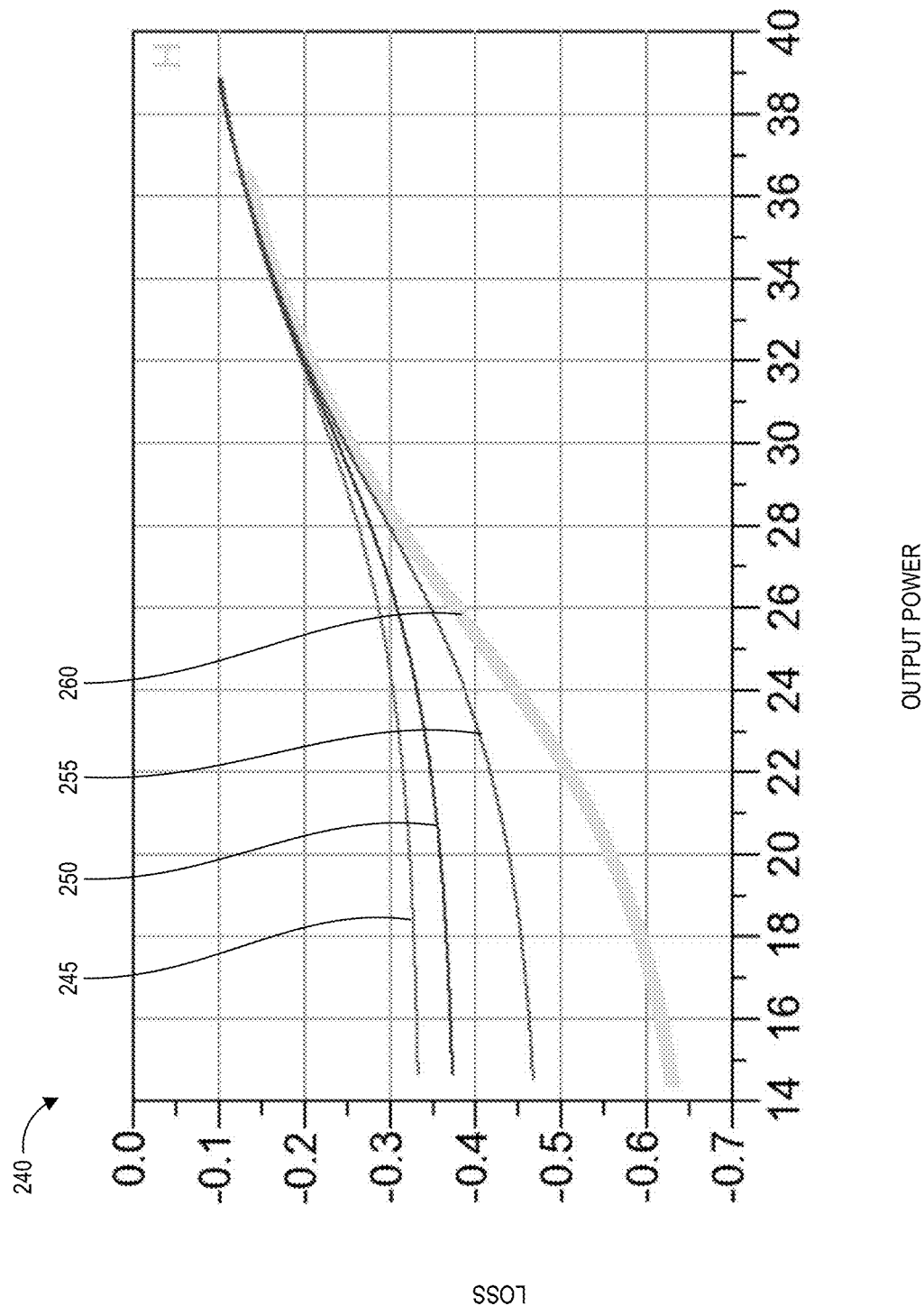
FIG. 16 is a plot illustrating the loss of a distortion network when varying the number of channelized resistors in accordance with aspects of this disclosure.

FIG. 16 is a plot illustrating the loss of a distortion network when varying the number of channelized resistors in accordance with aspects of this disclosure. In particular, the plot 240 illustrates the loss for a distortion network (e.g., see FIG. 9) including five channelized resistors (curve 245), seven channelized resistors (curve 250), nine channelized resistors (curve 255), and eleven channelized resistors (curve 260). As shown in FIG. 16, as the number channelized resistors increases, the loss increases. Thus, the number of channelized resistors can be selected to compensate for gain compression of a particular power amplifier, thereby flattening the gain vs. output power curve of the power amplifier.

Figure 17:
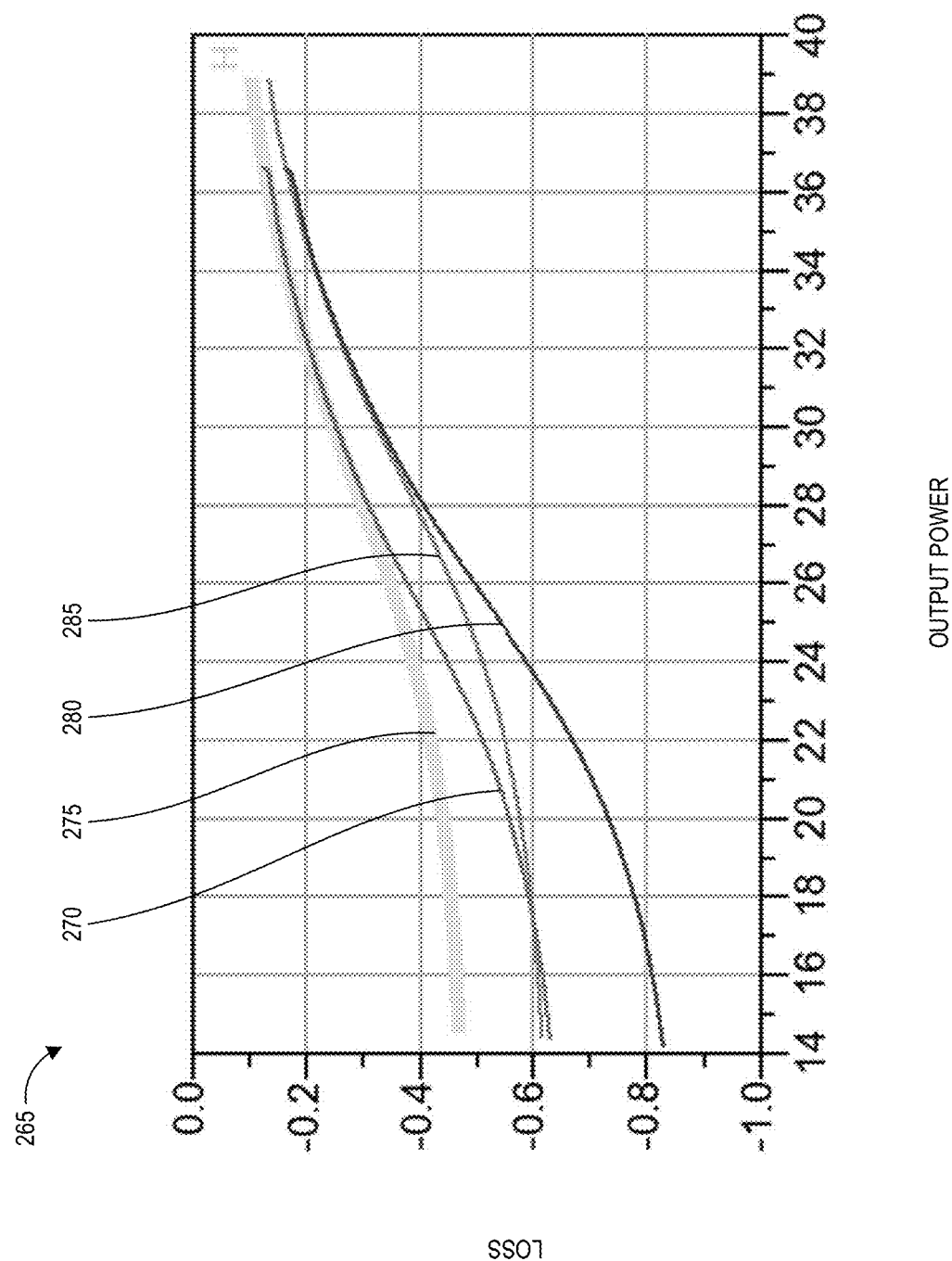
FIG. 17 is a plot illustrating the loss of various distortion networks in accordance with aspects of this disclosure.

FIG. 17 is a plot illustrating the loss of various distortion networks in accordance with aspects of this disclosure. In particular, the plot 265 illustrates the loss for distortion networks having different channel widths and numbers of channelized resistors. In particular, curve 270 represents a distortion network having five channelized resistors, each having a channel width of 15 μm; curve 275 represents a distortion network having seven channelized resistors, each having a channel width of 15 μm; curve 280 represents a distortion network having five channelized resistors, each having a channel width of 20 μm; and curve 285 represents a distortion network having seven channelized resistors, each having a channel width of 20 μm. As can be seen from FIG. 17, the particular shape of the loss vs. output power curve can be adjusted by varying both the channel width and number of channelize resistors. These parameters can be used to alter the distortion networks' loss and "turn-on" level at which the instantaneous resistance approaches infinity. These changes in the distortion network parameters can enable the distortion networks to compensate for gain compression of power amplifiers having different gain compression curves.

Figure 18A:
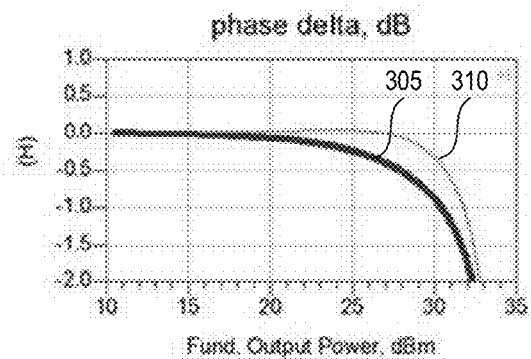
FIGS. 18A-18C are plots illustrating the phase distortion (AM/PM) and gain distortion (AM/AM) for an example distortion network in accordance with aspects of this disclosure.
Figure 18B:
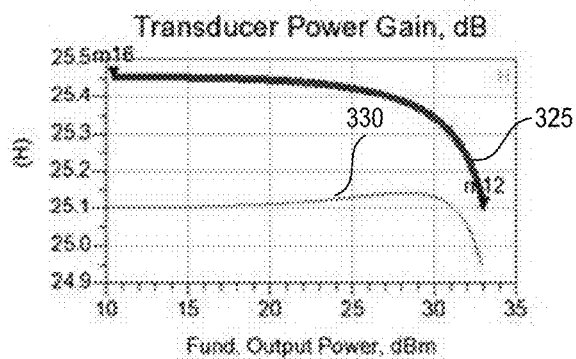
Figure 18C:
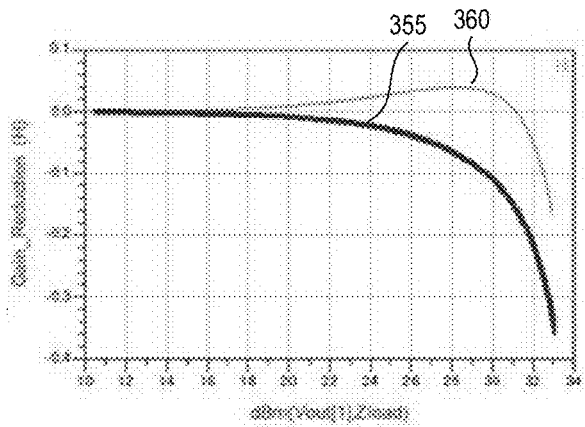

FIGS. 18A-18C are plots illustrating the phase distortion (AM/PM) and gain distortion (AM/AM) for an example distortion network in accordance with aspects of this disclosure. In particular, FIG. 18A is a plot which illustrates a curve 305 of the phase distortion of a power amplifier without channelized resistors and a curve 310 of the phase distortion of a power amplifier including the channelized resistor network as described herein. As shown in FIG. 18A, the curve 310 of the power amplifier including the channelized resistor network has less phase distortion than the curve 305 of the power amplifier without channelized resistors. FIG. 18B is a plot which illustrates a curve 325 of the transducer power gain of a power amplifier without channelized resistors and a curve 330 of the transducer power gain of a power amplifier including the channelized resistor network as described herein. As shown in FIG. 18C, the gain of the curve 330 for the power amplifier including the channelized resistor network has a flatter profile than the curve 325 for the power amplifier without the channelized resistor network.

FIG. 18C is a plot which illustrates a curve 355 of the transducer power gain of a power amplifier without channelized resistors and a curve 360 of the transducer power gain of a power amplifier including the channelized resistor network as described herein. As shown in FIG. 18C, the gain of the curve 360 for the power amplifier including the channelized resistor network has a flatter profile than the curve 355 for the power amplifier without the channelized resistor network. As can be seen from the plots illustrated in FIGS. 18A-18C, the channelized resistor network is over compensated to achieve gain expansion.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
   a power amplifier including an input configured to receive a radio frequency input signal and an output configured to output an amplified radio frequency signal; and
   a distortion network electrically coupled to either the input or the output of the power amplifier, the distortion network including one or more semiconductor resistors each including a body portion doped with a first doping type, a first terminal region doped with a second doping type, and a second terminal region doped with the second doping type, a conductivity of a channel formed in the body portion between the first terminal region and the second terminal region being controlled by a voltage applied between the first terminal region and the second terminal region, and a relationship of a current of the channel vs. the voltage applied between the first terminal region and the second terminal region forming a hyperbolic curve.

2. The power amplifier system of claim 1 wherein a resistance of each of the one or more semiconductor resistors increases as the voltage applied between the first terminal region and the second terminal region increases until a saturation point.

3. The power amplifier system of claim 1 wherein the input of the power amplifier includes a pair of differential inputs, the output of the power amplifier includes a pair of differential outputs, and the distortion network is connected between either the differential inputs or the differential outputs.

4. The power amplifier system of claim 1 wherein the distortion network is connected between ground and one of the input and the output of the power amplifier.

5. The power amplifier system of claim 1 wherein the distortion network further includes a capacitor connected in series with the one or more semiconductor resistors.

6. The power amplifier system of claim 1 wherein the conductivity is dependent only on the voltage between the first terminal region and the second terminal region.

7. The power amplifier system of claim 1 wherein each of the one or more semiconductor resistors does not include a connected gate terminal.

8. The power amplifier system of claim 7 wherein each of the one or more semiconductor resistors includes a floating gate terminal.

9. The power amplifier system of claim 1 wherein hyperbolic curve is a hyperbolic tangent curve.

10. A power amplifier system comprising:
    a power amplifier including an input configured to receive a radio frequency input signal and an output configured to output an amplified radio frequency signal; and
    a distortion network electrically coupled to either the input or the output of the power amplifier, the distortion network including one or more semiconductor resistors each including a body portion doped with a first doping type, a first terminal region doped with a second doping type, and a second terminal region doped with the second doping type, and each having a resistance that increases as a voltage applied between the first terminal region and the second terminal region increases until a point at which a channel of the semiconductor resistor saturates.

11. The power amplifier system of claim 10 wherein the input of the power amplifier includes a pair of differential inputs, the output of the power amplifier includes a pair of differential outputs, and the distortion network is connected between either the differential inputs or the differential outputs.

12. The power amplifier system of claim 10 wherein the resistance is dependent only on the voltage applied between the first terminal region and the second terminal region to the semiconductor resistor.

13. The power amplifier system of claim 10 wherein each of the one or more semiconductor resistors does not include a connected gate terminal.

14. The power amplifier system of claim 13 wherein each of the one or more semiconductor resistors includes a floating gate terminal.

15. The power amplifier system of claim 10 wherein each of the one or more semiconductor resistors includes a field-effect transistor not including a gate electrode or a field-effect transistor having a floating gate electrode.

16. The power amplifier system of claim 1 wherein the distortion network further includes a capacitor connected in series with the one or more semiconductor resistors.

17. A power amplifier system comprising:
    a power amplifier including an input configured to receive a radio frequency input signal and an output configured to output an amplified radio frequency signal, the input of the power amplifier including a pair of differential inputs, and the output of the power amplifier including a pair of differential outputs; and
    a distortion network electrically coupled to either the input or the output of the power amplifier, the distortion network including one or more semiconductor resistors, each including a body portion doped with a first doping type, a first terminal region doped with a second doping type, and a second terminal region doped with the second doping type, a conductivity of a channel formed in the body portion between the first terminal region and the second terminal region being controlled by a voltage applied between the first terminal region and the second terminal region, and the distortion network connected between either the differential inputs or the differential outputs.

18. The power amplifier system of claim 17 wherein the conductivity is dependent only on the voltage applied between the first terminal region and the second terminal region.

19. The power amplifier system of claim 17 wherein each of the one or more semiconductor resistors does not include a connected gate terminal.

20. The power amplifier system of claim 19 wherein each of the one or more semiconductor resistors includes a floating gate terminal.

* * * * *